US012696674B2

(12) United States Patent
Kim et al.

(10) Patent No.: US 12,696,674 B2
(45) Date of Patent: *Jul. 28, 2026

(54) METHOD OF MANUFACTURING A THIN FILM OF PEROVSKITE COMPOUND AND METHOD OF MANUFACTURING A SOLAR CELL USING THE SAME

(71) Applicant: JUSUNG ENGINEERING CO., LTD., Gwangju-si (KR)

(72) Inventors: JaeHo Kim, Gwangju-si (KR); Chul Joo Hwang, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 567 days.

This patent is subject to a terminal disclaimer.

(21) Appl. No.: 17/638,802

(22) PCT Filed: Jul. 30, 2021

(86) PCT No.: PCT/KR2021/009945

§ 371 (c)(1),
(2) Date: Feb. 25, 2022

(87) PCT Pub. No.: WO2022/030888

PCT Pub. Date: Feb. 10, 2022

(65) Prior Publication Data

US 2022/0336158 A1 Oct. 20, 2022

(30) Foreign Application Priority Data

Aug. 7, 2020 (KR) ........................ 10-2020-0098927
Sep. 29, 2020 (KR) ........................ 10-2020-0127216

(Continued)

(51) Int. Cl.
*H10K 71/12* (2023.01)
*H01G 9/00* (2006.01)

(Continued)

(52) U.S. Cl.
CPC ........... *H10K 71/12* (2023.02); *H01G 9/0036* (2013.01); *H01G 9/2009* (2013.01); *H01G 9/209* (2013.01);

(Continued)

(58) Field of Classification Search
CPC .... H01G 9/0036; H01G 9/2009; H01G 9/209; H10K 30/30; H10K 30/87; H10K 30/88;

(Continued)

(56) References Cited

U.S. PATENT DOCUMENTS

2013/0260024 A1* 10/2013 Jodin ...................... C23C 16/40
427/126.1
2020/0332408 A1* 10/2020 Irwin .................. C23C 14/3407

FOREIGN PATENT DOCUMENTS

CN 110578175 A * 12/2019
CN 111357120 A 6/2020

(Continued)

OTHER PUBLICATIONS

Montan, Preparation of methylammonium lead iodide CH3NH3PbI3 thin film perovskite solar cells by chemical vapor deposition using methylamine gas and hydrogen iodide gas, 2020, Energy Science and Engineering, 8, p. 3165-3173 (Year: 2020).*

(Continued)

*Primary Examiner* — Dah-Wei D. Yuan
*Assistant Examiner* — Nga Leung V Law
(74) *Attorney, Agent, or Firm* — Renaissance IP Law Group LLP

(57) ABSTRACT

The present inventive concept relates to a method of manufacturing a thin film of a perovskite compound, including a process of reacting at least one compound selected from among an amine-based compound and an amidine-based compound, an organic metal compound including a divalent positive ion, and at least one hydrogen halide, and a method of manufacturing a solar cell using the same, and (Continued)

According to the present inventive concept, because a perovskite compound is manufactured by performing a reaction through a chemical vapor deposition (CVD) process and an atomic layer deposition (ALD) process, step coverage may be enhanced, and thus, it may be possible to form a thin film having a uniform thickness and a problem where a solvent remains may also be solved.

5 Claims, 8 Drawing Sheets

(30) Foreign Application Priority Data

Apr. 26, 2021 (KR) ........................ 10-2021-0053659
Jul. 27, 2021 (KR) ........................ 10-2021-0098690

(51) Int. Cl.

| | |
|---|---|
| ***H01G 9/20*** | (2006.01) |
| ***H10K 30/40*** | (2023.01) |
| ***H10K 30/50*** | (2023.01) |
| ***H10K 30/87*** | (2023.01) |
| ***H10K 30/88*** | (2023.01) |
| ***H10K 71/10*** | (2023.01) |
| ***H10K 85/30*** | (2023.01) |
| ***H10K 85/50*** | (2023.01) |

(52) U.S. Cl.
CPC ............ *H10K 30/87* (2023.02); *H10K 30/88* (2023.02); *H10K 71/10* (2023.02); *H10K 85/30* (2023.02); *H10K 85/50* (2023.02); *H10K 30/40* (2023.02); *H10K 30/50* (2023.02)

(58) Field of Classification Search
CPC ........ H10K 71/10; H10K 85/30; H10K 30/50; H10K 85/50; H10K 30/40; H10K 71/12; H10K 85/60; H10K 85/40; Y02E 10/549; H01L 31/0256; C07C 209/00; C07C 257/12; C07F 7/10; C23C 16/30; C23C 16/45525
See application file for complete search history.

(56) References Cited

FOREIGN PATENT DOCUMENTS

| | | | | |
|---|---|---|---|---|
| JP | 2017137234 | A | * | 8/2017 |
| JP | 2018093168 | A | | 6/2018 |
| KR | 20150124412 | A | | 11/2015 |
| KR | 20180099577 | A | | 9/2018 |
| KR | 20190010197 | A | | 1/2019 |
| KR | 20190021135 | A | | 3/2019 |
| WO | 2016194317 | A1 | | 12/2016 |
| WO | 2020214994 | A1 | | 10/2020 |

OTHER PUBLICATIONS

International Search Report for PCT/KR2021/009945, mailed Nov. 11, 2021.

Mortan, Claudiu et al., "Preparation of methylammonium lead iodide (CH3NH3PbI3) thin film perovskite solar cells by chemical vapor deposition using methylamine gas (CH3NH2) and hydrogen iodide gas", Energy Science and Engineering, May 22, 2020, vol. 8, Issue 9, pp. 3165-3173.

Stoumpos, Constantinos C. et al., "High Members of the 2D Ruddlesden-Popper Halide Perovskites: Synthesis, Optical Properties, and Solar Cells of (CH3(CH2)3NH3)2(CH3NH3)4Pb5I16", Chem, vol. 2, Issue 3, Mar. 9, 2017, pp. 427-440.

* cited by examiner

METHOD OF MANUFACTURING A THIN FILM OF PEROVSKITE COMPOUND AND METHOD OF MANUFACTURING A SOLAR CELL USING THE SAME

TECHNICAL FIELD

The present inventive concept relates to a method of manufacturing a thin film of a perovskite compound and a method of manufacturing a solar cell using the same.

BACKGROUND ART

In the related art, a solution process is mainly used in manufacturing a solar cell by using a perovskite compound. The solution process dissolves a perovskite compound in a certain solvent to coat a liquid perovskite compound on a substrate by using a process such as a spin coating process, a spray coating process, or a slot die process.

In such a solution process, there is no problem in a case where a perovskite compound is coated on a substrate including a flat surface, but in a case where a tandem solar cell is formed by coating a perovskite compound on a crystalline silicon substrate having concavities and convexities such as a pyramid structure, it is not easy to form a thin film having a uniform thickness due to the defect of step coverage.

Moreover, in a case which uses the solution process, a solvent remains in a thin film and acts as impurities which degrade film quality, and due to this, the efficiency of a solar cell may be reduced.

DISCLOSURE

Technical Problem

The present inventive concept is devised to solve the above-described problem, and it is an object of the present inventive concept to provide a method of manufacturing a thin film of a perovskite compound, in which step coverage is enhanced by manufacturing a thin film by using a deposition process, it is possible to form a thin film having a uniform thickness, and a problem where a solvent remains may also be solved, and a method of manufacturing a solar cell using the thin film.

Technical Solution

To accomplish the above-described objects, the present inventive concept provides a method of manufacturing a thin film of a perovskite compound, the method including a process of reacting at least one compound selected from among an amine-based compound and an amidine-based compound, an organic metal compound including a divalent positive ion, and at least one hydrogen halide.

Moreover, the present inventive concept provides a method of manufacturing a thin film of a perovskite compound, the method including: a first step of supplying, as a first source material, at least one compound of an amine-based compound, an amidine-based compound, and an organic metal compound including a divalent positive ion; a second step of purging the first source material; a third step of supplying at least one hydrogen halide as a first reactant; and a fourth step of purging the first reactant.

Moreover, the present inventive concept provides a method of manufacturing a solar cell, the method including: a process of forming a crystalline solar cell; a process of forming a buffer layer on the crystalline solar cell; a process of forming a perovskite solar cell on the buffer layer; and a process of forming a first electrode on the perovskite solar cell and forming a second electrode on the crystalline solar cell, wherein the process of forming the perovskite solar cell includes a process of reacting at least one compound selected from among an amine-based compound and an amidine-based compound, an organic metal compound including a divalent positive ion, and at least one hydrogen halide.

Advantageous Effect

According to the present inventive concept, the following effects are obtained.

According to an embodiment of the present disclosure, because a perovskite compound is manufactured by reacting at least one compound, selected from among an amine-based compound and an amidine-based compound, with an organic metal compound including a divalent positive ion and at least one hydrogen halide through a chemical vapor deposition (CVD) process, step coverage may be enhanced, and thus, it may be possible to form a thin film having a uniform thickness and a problem where a solvent remains may also be solved.

According to an embodiment of the present inventive concept, a thin film may be formed through a CVD process or an atomic layer deposition (ALD) process at a room temperature to 200° C. or less (preferably, a temperature of 50° C. to 150° C.), and thus, an organic material in a finally-obtained perovskite compound may be prevented from being decomposed in performing the CVD process or the ALD process.

According to an embodiment of the present inventive concept, a light absorption rate, a band gap, carrier mobility, and material stability of the finally-obtained perovskite compound may be adjusted based on the kind of the organic metal compound including the divalent positive ion.

According to an embodiment of the present inventive concept, the band gap of the finally-obtained perovskite compound may be adjusted based on the kind of the hydrogen halide.

According to another embodiment of the present inventive concept, at least one alkali metal-based compound may be added to a reactant, and thus, the instability of a monovalent organic positive ion vulnerable to water, heat, and plasma may be complemented.

MODE FOR INVENTION

Figure 1A:
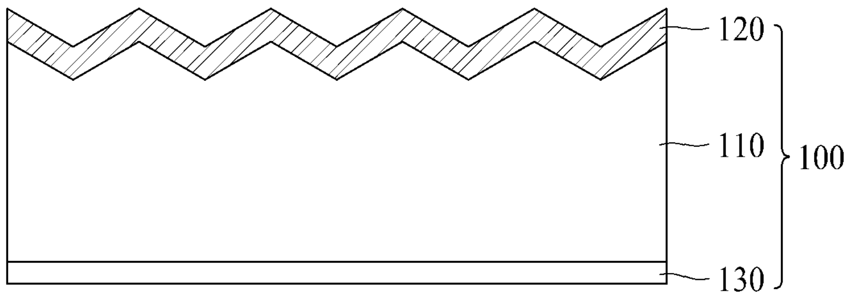
FIGS. 1A to 1D are process cross-sectional views illustrating a method of manufacturing a solar cell according to an embodiment of the present inventive concept.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art may sufficiently understand. The embodiments of the present disclosure may be carried out independently from each other, or may be carried out together in co-dependent relationship.

Hereinafter, embodiments of the present disclosure will be described in detail with reference to the accompanying drawings. In adding reference numerals to elements of each of the drawings, although the same elements are illustrated in other drawings, like reference numerals may refer to like elements.

Hereinafter, a preferable embodiment of the present inventive concept will be described in detail with reference to the accompanying drawings.

A thin film of a perovskite compound according to an embodiment of the present inventive concept is obtained through a process of forming a compound of $ABX_3$ by reacting at least one compound, selected from among an amine-based compound and an amidine-based compound, with an organic metal compound including a divalent positive ion and at least one hydrogen halide.

In the $ABX_3$, the A may be composed of a monovalent organic positive ion of the amine-based compound, composed of a monovalent organic positive ion of the amidine-based compound, or composed of both of the monovalent organic positive ion of the amine-based compound and the monovalent organic positive ion of the amidine-based compound. The A may be composed in a structure where the monovalent organic positive ion of the amine-based compound is added thereto at an x ratio and the monovalent organic positive ion of the amidine-based compound is added thereto at a y ratio. Here, each of x and y is more than 0, and x+y=1.

In the $ABX_3$, the B may be composed of the divalent positive ion.

In the $ABX_3$, the X may be composed of at least one halogen compound.

The amine-based compound may be selected from the group consisting of methylamine, ethylamine, and phenethylamine.

The amidine-based compound may be composed of formamidine.

An organic metal compound including the divalent positive ion may include metal selected from the group consisting of plumbum (Pb), tin (Sn), germanium (Ge), antimony (Sb), bismuth (Bi), and barium (Ba).

In particular, the organic metal compound including the divalent positive ion may be composed of a compound represented by the following Chemical Scheme 1:

Chemical Scheme 1

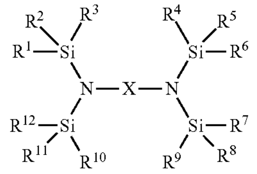

(In the Chemical Scheme 1, each of $R^1$ to $R^{12}$ is independently composed of hydrogen or an alkyl group, and the X is selected from the group consisting of Pb, Sn, Ge, Sb, Bi, and Ba)

Alternatively, the organic metal compound including the divalent positive ion may be selected from the group consisting of $Pb(CH_3)_4$, $Pb(C_2H_5)_4$, $Pb(SCN)_2$, $(C_2H_5)_3PbOCH_2C(CH_3)_3$, $Pb(C_{11}H_{19}O_2)_2$, $Pb(CH_3)_3C$—$COCHCO$—$C(CH_3)_3)_2$, $Pb((C_6H_5)_2PCH_2P(C_6H_5)_2)_2$, $Pb(N(CH_3)_2C(CH_3)_2OH)_2$, and $C_{12}H_{28}N_2O_2Pb$.

A light absorption rate, a band gap, carrier mobility, and material stability of a finally-obtained perovskite compound may be adjusted based on the kind of the organic metal compound including the divalent positive ion.

The hydrogen halide may be selected from the group consisting of HI, HBr, Hf, and HCl. The band gap of the finally-obtained perovskite compound may be adjusted based on the kind of the hydrogen halide.

The amine-based compound, the amidine-based compound, the organic metal compound including the divalent positive ion, and the hydrogen halide are composed of a material which is vaporized at a temperature within a range of a room temperature to 200° C., and preferably, is composed of a material which is vaporized at a temperature within a range of 50° C. to 150° C. Therefore, a process of manufacturing the compound of the $ABX_3$ may be performed through a chemical vapor deposition (CVD) or an atomic layer deposition (ALD) process at 200° C. or less (preferably, a temperature of 150° C. or less), and thus, an organic material in a finally-obtained compound of $ABX_3$ may be prevented from being decomposed in performing the CVD process or the ALD process. It is possible to apply plasma in performing the CVD process or the ALD process.

A perovskite compound according to another embodiment of the present inventive concept is obtained through a process of forming a compound of $CABX_3$ by reacting at least one compound, selected from among an amine-based compound and an amidine-based compound, with at least one alkali metal-based compound, an organic metal compound including a divalent positive ion, and hydrogen halide.

In the $CABX_3$, the A may be composed of a monovalent organic positive ion of the amine-based compound, composed of a monovalent organic positive ion of the amidine-based compound, or composed of both of the monovalent organic positive ion of the amine-based compound and the monovalent organic positive ion of the amidine-based compound.

In the $CABX_3$, the C may be composed of the at least one alkali metal.

The CA may be composed in a structure where the monovalent organic positive ion of the amine-based compound is added thereto at an x ratio, the monovalent organic positive ion of the amidine-based compound is added thereto at a y ratio, and a monovalent positive ion of the alkali metal is added thereto at a z ratio. Here, x, y, and z are more than 0, and x+y+z=1.

In the $CABX_3$, the B may be composed of the divalent positive ion, and the X is composed of at least one halogen compound.

The amine-based compound, the amidine-based compound, the organic metal compound including the divalent positive ion, and the hydrogen halide are as described above, and thus, repeated descriptions are omitted.

The alkali metal-based compound may be composed of a compound represented by the following Chemical Scheme 2:

Chemical Scheme 2

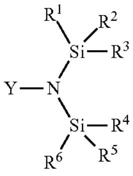

(In the Chemical Scheme 2, each of $R^1$ to $R^6$ is independently composed of hydrogen or an alkyl group, and the Y is alkali metal)

As described above, according to another embodiment of the present inventive concept, at least one alkali metal-based compound may be added to a reactant, and thus, the instability of a monovalent organic positive ion vulnerable to water, heat, and plasma may be complemented.

The following Reaction Scheme 1 is a reaction scheme in a method of forming a thin film of a perovskite compound using a CVD process according to an embodiment of the present inventive concept.

Reaction Scheme 1

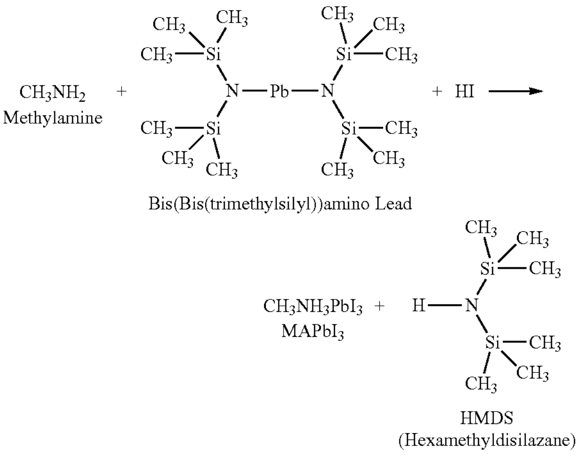

$CH_3NH_2$
Methylamine
Bis(Bis(trimethylsilyl))amino Lead
$CH_3NH_3PbI_3$
$MAPbI_3$
HMDS
(Hexamethyldisilazane)

As seen in the Reaction Scheme 1, by reacting methylamine, bis(bis(trimethylsilyl)amino lead as the organic metal compound including the divalent positive ion, and hydrogen iodide as hydrogen halide, a compound of $CH_3NH_3PbI_3(MAPbI_3)$ is obtained as a perovskite compound, and moreover, hexamethyldisilazane (HMDS) is obtained as a byproduct.

Although not shown in the Reaction Scheme 1, a byproduct of methylammonium iodide ($CH_3NH_3I$) may be obtained by reacting methylamine with hydrogen iodide, and a byproduct of $PbI_2$ may also be obtained by reacting bis(bis(trimethylsilyl)amino lead with hydrogen iodide.

In the Reaction Scheme 1, ethylamine or phenethylamine may be reacted instead of the methylamine, hydrogen bromide (HBr) or hydrogen chloride (HCl) may be reacted instead of the hydrogen iodide, or an organic metal compound obtained by substituting lead (Pb) of the bis(bis(trimethylsilyl)amino lead with Sn, Ge, Sb, Bi, or Ba may be reacted.

The following Reaction Scheme 2 is a reaction scheme in a method of forming a thin film of a perovskite compound using a CVD process according to another embodiment of the present inventive concept.

Reaction Scheme 2

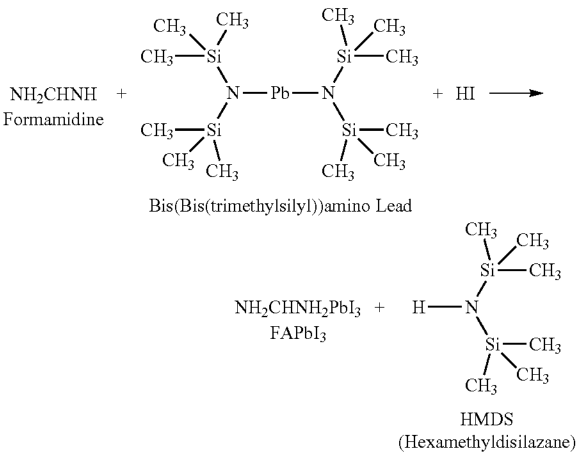

$NH_2CHNH$
Formamidine
Bis(Bis(trimethylsilyl))amino Lead
$NH_2CHNH_2PbI_3$
$FAPbI_3$
HMDS
(Hexamethyldisilazane)

As seen in the Reaction Scheme 2, by reacting formamidine, bis(bis(trimethylsilyl)amino lead as an organic metal compound including a divalent positive ion, and hydrogen iodide as hydrogen halide, a compound of $NH_2CHNH_2PbI_3$ ($FAPbI_3$) is obtained as a perovskite compound, and moreover, hexamethyldisilazane (HMDS) is obtained as a byproduct.

Although not shown in the Reaction Scheme 2, a byproduct of formamidinium iodide ($NH_2CHNH_2I$) may be obtained by reacting formamidine with hydrogen iodide, and moreover, a byproduct of $PbI_2$ may also be obtained by reacting bis(bis(trimethylsilyl)amino lead with hydrogen iodide.

In the Reaction Scheme 2, hydrogen bromide (HBr) or hydrogen chloride (HCl) may be reacted instead of the hydrogen iodide, or an organic metal compound obtained by substituting lead (Pb) of the bis(bis(trimethylsilyl)amino lead with Sn, Ge, Sb, Bi, or Ba may be reacted.

Band gap energy of a compound of $NH_2CHNH_2PbI_3$ ($FAPbI_3$) manufactured based on the Reaction Scheme 2 is 1.47 eV, and band gap energy of a compound of $CH_3NH_3PbI_3$($MAPbI_3$) manufactured based on the Reaction Scheme 1 is 1.57 eV. That is, the band gap energy of the compound of $NH_2CHNH_2PbI_3$($FAPbI_3$) manufactured based on the Reaction Scheme 2 is lower than the band gap energy of the compound of $CH_3NH_3PbI_3$($MAPbI_3$) manufactured based on the Reaction Scheme 1. Therefore, in a case where the compound of $NH_2CHNH_2PbI_3$($FAPbI_3$) manufactured based on the Reaction Scheme 2 is used as a light absorption layer of a solar cell, wider sunlight spectrum may be absorbed than a case where the compound of $CH_3NH_3PbI_3$($MAPbI_3$) manufactured based on the Reaction Scheme 1 is used as the light absorption layer of the solar cell.

The following Reaction Scheme 3 is a reaction scheme in a method of forming a thin film of a perovskite compound using a CVD process according to another embodiment of the present inventive concept.

Reaction Scheme 3

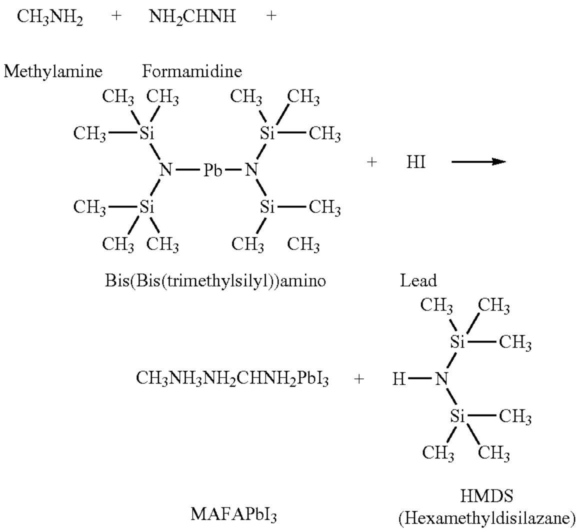

$CH_3NH_2$ + $NH_2CHNH$ +

Methylamine Formamidine

Bis(Bis(trimethylsilyl))amino Lead $CH_3NH_3NH_2CHNH_2PbI_3$ $MAFAPbI_3$

HMDS (Hexamethyldisilazane)

As seen in the Reaction Scheme 3, by reacting methylamine, formamidine, bis(bis(trimethylsilyl)amino lead as an organic metal compound including a divalent positive ion, and hydrogen iodide as hydrogen halide, a compound of $CH_3NH_3NH_2CHNH_2PbI_3$($MAFAPbI_3$) is obtained as a perovskite compound, and moreover, hexamethyldisilazane (HMDS) is obtained as a byproduct.

Although not shown in the Reaction Scheme 3, a byproduct of methylammonium iodide ($CH_3NH_3I$) may be obtained by reacting methylamine with hydrogen iodide, a byproduct of formamidinium iodide ($NH_2CHNH_2I$) may be obtained by reacting formamidine with hydrogen iodide, and moreover, a byproduct of $PbI_2$ may also be obtained by reacting bis(bis(trimethylsilyl)amino lead with hydrogen iodide.

In the Reaction Scheme 3, ethylamine or phenethylamine may be reacted instead of the methylamine, hydrogen bromide (HBr) or hydrogen chloride (HCl) may be reacted instead of the hydrogen iodide, or an organic metal compound obtained by substituting lead (Pb) of the bis(bis(trimethylsilyl)amino lead with Sn, Ge, Sb, Bi, or Ba may be reacted.

A compound of $CH_3NH_3NH_2CHNH_2PbI_3$($MAFAPbI_3$) manufactured based on the Reaction Scheme 3 may have a plurality of monovalent positive ions, and thus, a perovskite solar cell having high efficiency may be obtained in a case where a compound of $CH_3NH_3NH_2CHNH_2PbI_3$($MAFAPbI_3$) manufactured based on the Reaction Scheme 3 is used as a light absorption layer of a solar cell.

The following Reaction Scheme 4 is a reaction scheme in a method of forming a thin film of a perovskite compound using a CVD process according to another embodiment of the present inventive concept.

Reaction Scheme 4

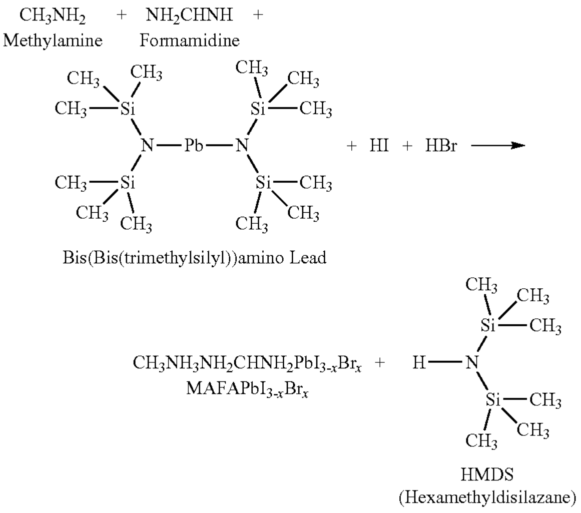

$CH_3NH_2$ + $NH_2CHNH$ +

Methylamine Formamidine

Bis(Bis(trimethylsilyl))amino Lead $CH_3NH_3NH_2CHNH_2PbI_{3-x}Br_x$ $MAFAPbI_{3-x}Br_x$ HMDS (Hexamethyldisilazane)

As seen in the Reaction Scheme 4, by reacting methylamine, formamidine, bis(bis(trimethylsilyl)amino lead as an organic metal compound including a divalent positive ion, hydrogen iodide and hydrogen bromide as hydrogen halide, a compound of $CH_3NH_3NH_2CHNH_2PbI_{3-x}Br_x$ (where x is an integer of 0 to 3) ($MAFAPbI_{3-x}Br_x$) is obtained as a perovskite compound, and moreover, hexamethyldisilazane (HMDS) is obtained as a byproduct.

Although not shown in the Reaction Scheme 4, a byproduct of methylammonium iodide ($CH_3NH_3I$) may be obtained by reacting methylamine with hydrogen iodide, a byproduct of formamidinium iodide ($NH_2CHNH_2I$) may be obtained by reacting formamidine with hydrogen iodide, and moreover, a byproduct of $PbI_2$ may also be obtained by reacting bis(bis(trimethylsilyl)amino lead with hydrogen iodide.

In the Reaction Scheme 4, ethylamine or phenethylamine may be reacted instead of the methylamine, hydrogen chloride (HCl) may be reacted instead of the hydrogen iodide or hydrogen bromide, or an organic metal compound obtained by substituting lead (Pb) of the bis(bis(trimethylsilyl)amino lead with Sn, Ge, Sb, Bi, or Ba may be reacted.

A compound of $CH_3NH_3NH_2CHNH_2PbI_{3-x}Br_x$ (where x is an integer of 0 to 3) ($MAFAPbI_{3-x}Br_x$) manufactured based on the Reaction Scheme 4 is obtained by doping a plurality of halogen materials, and a band gap thereof may be precisely controlled to a wider range than a band gap of a compound of $CH_3NH_3NH_2CHNH_2PbI_3$($MAFAPbI_3$) manufactured based on the Reaction Scheme 3.

The following Reaction Scheme 5 is a reaction scheme in a method of forming a thin film of a perovskite compound using a CVD process according to another embodiment of the present inventive concept.

Reaction Scheme 5

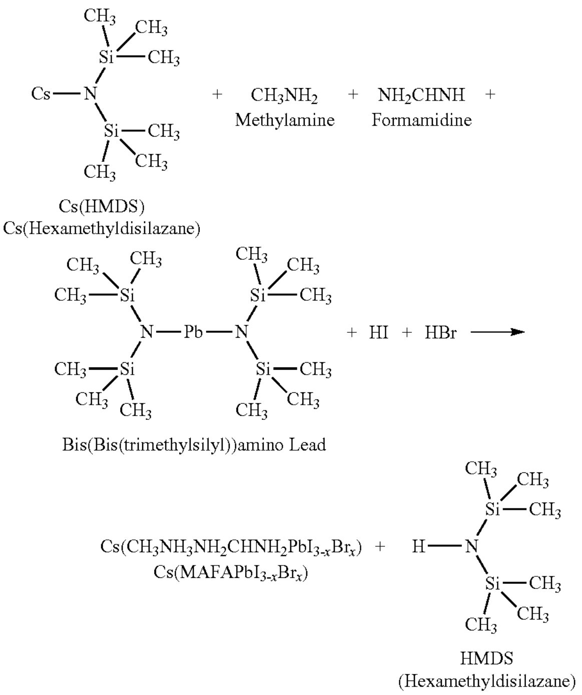

As seen in the Reaction Scheme 5, by reacting Cs (hexamethyldisilazane (HMDS)) as an alkali metal-based compound, methylamine, formamidine, bis(bis(trimethylsilyl)amino lead as an organic metal compound including a divalent positive ion, hydrogen iodide and hydrogen bromide as hydrogen halide, a compound of $Cs(CH_3NH_3NH_2CHNH_2PbI_{3-x}Br_x)$ (where x is an integer of 0 to 3) ($Cs(MAFAPbI_{3-x}Br_x)$) is obtained as a perovskite compound, and moreover, hexamethyldisilazane (HMDS) is obtained as a byproduct.

Although not shown in the Reaction Scheme 5, a byproduct of methylammonium iodide ($CH_3NH_3I$) may be obtained by reacting methylamine with hydrogen iodide, a byproduct of formamidinium iodide ($NH_2CHNH_2I$) may be obtained by reacting formamidine with hydrogen iodide, and moreover, a byproduct of $PbI_2$ may also be obtained by reacting bis(bis(trimethylsilyl)amino lead with hydrogen iodide.

In the Reaction Scheme 5, an alkali metal-based compound obtained by substituting cesium (Cs) of the alkali metal-based compound with lithium (Li), sodium (Na), potassium (K), rubidium (Rb), or francium (Fr) may be reacted, ethylamine or phenethylamine may be reacted instead of the methylamine, hydrogen chloride (HCl) may be reacted instead of the hydrogen iodide or hydrogen bromide, or an organic metal compound obtained by substituting lead (Pb) of the bis(bis(trimethylsily)amino lead with Sn, Ge, Sb, Bi, or Ba may be reacted.

The following Reaction Scheme 6 is a reaction scheme in a method of forming a thin film of a perovskite compound using a CVD process according to another embodiment of the present inventive concept.

Reaction Scheme 6

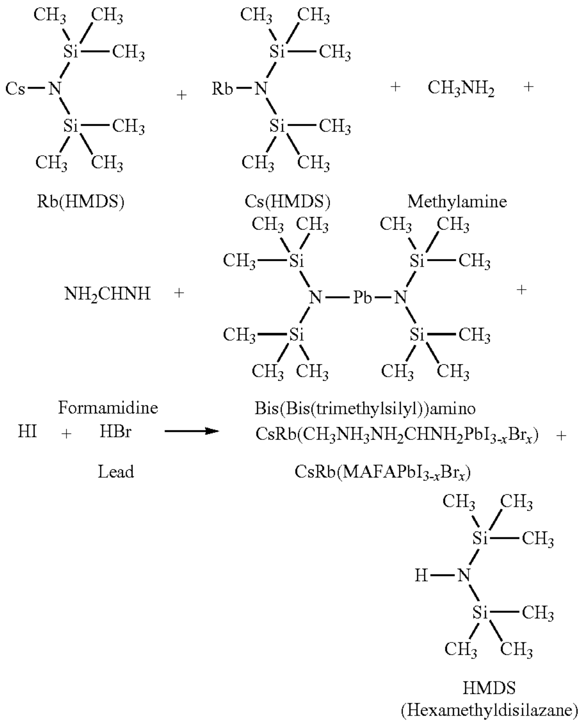

As seen in the Reaction Scheme 6, by reacting Cs (hexamethyldisilazane (HMDS)) and Rb(hexamethyldisilazane (HMDS)) as an alkali metal-based compound, methylamine, formamidine, bis(bis(trimethylsilyl)amino lead as an organic metal compound including a divalent positive ion, hydrogen iodide and hydrogen bromide as hydrogen halide, a compound of $CsRb(CH_3NH_3NH_2CHNH_2PbI_{3-x}Br_x)$ (where x is an integer of 0 to 3) ($CsRb(MAFAPbI_{3-x}Br_x)$) is obtained as a perovskite compound, and moreover, hexamethyldisilazane (HMDS) is obtained as a byproduct.

Although not shown in the Reaction Scheme 6, a byproduct of methylammonium iodide ($CH_3NH_3I$) may be obtained by reacting methylamine with hydrogen iodide, a byproduct of formamidinium iodide ($NH_2CHNH_2I$) may be obtained by reacting formamidine with hydrogen iodide, and moreover, a byproduct of $PbI_2$ may also be obtained by reacting bis(bis(trimethylsilyl)amino lead with hydrogen iodide.

In the Reaction Scheme 6, an alkali metal-based compound obtained by substituting cesium (Cs) or rubidium (Rb) of the alkali metal-based compound with lithium (Li), sodium (Na), potassium (K), or francium (Fr) may be reacted, ethylamine or phenethylamine may be reacted instead of the methylamine, hydrogen chloride (HCl) may be reacted instead of the hydrogen iodide or hydrogen bromide, or an organic metal compound obtained by substituting lead (Pb) of the bis(bis(trimethylsilyl)amino lead with Sn, Ge, Sb, Bi, or Ba may be reacted.

Moreover, according to another embodiment of the present inventive concept, a thin film of a perovskite compound may be formed by an ALD process.

An ALD process according to a first embodiment of the present inventive concept may include a first step of supplying a source material into a chamber, a second step of purging the source material, a third step of supplying a reactant into the chamber, and a fourth step of purging the reactant and may include a process of repeatedly performing one cycle including the first to fourth steps, and the first embodiment has an advantage where a thin film of a perovskite compound may be formed by a simplest ALD process compared to below-described second to fourth embodiments.

The first step of supplying the source material may include a process of supplying at least one compound selected from among the amine-based compound and the amidine-based compound described above, and an organic metal compound including a divalent positive ion into the chamber.

Alternatively, the first step of supplying the source material may include a process of supplying at least one compound selected from among an amine-based compound and an amidine-based compound described above, an organic metal compound including a divalent positive ion, and at least one alkali metal-based compound into the chamber.

The third step of supplying the reactant may include a process of supplying at least one hydrogen halide into the chamber, and in this case, may supply the hydrogen halide in a plasma state.

A compound, a process temperature, and a reaction byproduct in the ALD process may respectively be the same as those in the above-described CVD process. For example, methylamine ($CH_3NH_2$) may be used as the amine-based compound. Also, methyl ammonium iodide ($CH_3NH_3I$) may be used as the amine-based compound. The $CH_3NH_3I$ may be solid at a room temperature, but the $CH_3NH_3I$ may be sublimated at about 100° C. and may be used in a CVD process or an ALD process. Formamidine ($NH_2CHNH$) may be used as the amidine-based compound. Also, formamidium chloride ($NH_2CHNH_2Cl$), formamidium iodide ($NH_2CHNH_2I$), or formamidium bromide ($NH_2CHNHBr$) may be used as the amidine-based compound. HCl, HI, or HBr may be used as the reactant.

An ALD process according to a second embodiment of the present inventive concept may include a first step of supplying a first source material into a chamber, a second step of purging the first source material, a third step of supplying a first reactant into the chamber, a fourth step of purging the first reactant, a fifth step of supplying a second source material into the chamber, a sixth step of purging the second source material, a seventh step of supplying a second reactant into the chamber, and an eighth step of purging the second reactant and may include a process of repeatedly performing one cycle including the first to eighth steps. In the second embodiment, a thin film of a perovskite compound is formed by a two-step process, and although a step is complicated and is performed for a long time, there is an advantage where it is easy to control a grain size or a composition ratio.

The first step of supplying the first source material into the chamber may include a process of supplying at least one compound selected from among the amine-based compound and the amidine-based compound described above, or may include a process of supplying the organic metal compound including the divalent positive ion.

For example, when the first step of supplying the first source material includes a process of supplying at least one compound selected from among the amine-based compound and the amidine-based compound described above, the fifth step of supplying the second source material may include a process of supplying the organic metal compound including the divalent positive ion. On the other hand, for example, when the first step of supplying the first source material includes a process of supplying the organic metal compound including the divalent positive ion, the fifth step of supplying the second source material may include a process of supplying at least one compound selected from among the amine-based compound and the amidine-based compound described above.

The third step of supplying the first reactant into the chamber and the seventh step of supplying the second reactant into the chamber may be performed through the same process, or may be performed through different processes. For example, the third step of supplying the first reactant into the chamber and the seventh step of supplying the second reactant into the chamber may comprise supplying the same reactant or different reactants. Also, all of the third step and the seventh step may comprise supplying hydrogen halide in a plasma state, but depending on the case, only one step of the third to seventh steps may comprise supplying hydrogen halide in a plasma state.

Moreover, the first step of supplying the first source material or the fifth step of supplying the second source material may further include a process of supplying the at least one alkali metal-based compound.

Depending on the case, the ALD process according to the second embodiment of the present inventive concept may comprise a ninth step of supplying a third source material by supplying the at least one alkali metal-based compound into the chamber after the eighth step, a tenth step of purging the third source material, an eleventh step of supplying a third reactant into the chamber, and a twelfth step of purging the third reactant and may include a process of repeatedly performing one cycle including the first to twelfth steps.

The eleventh step may be performed through the same process as the third step or the seventh step described above, or may be performed through different processes.

An ALD process according to a third embodiment of the present inventive concept may include a first step of supplying a first source material into a chamber, a second step of purging the first source material, a third step of supplying a first reactant into the chamber, a fourth step of purging the first reactant, a fifth step of simultaneously supplying a second source material and a second reactant into the chamber, and a sixth step of purging the second source material and the second reactant and may include a process of repeatedly performing one cycle including the first to sixth steps. In the third embodiment, like the second embodiment described above, a thin film of a perovskite compound is formed by a two-step process, and a step is simplified compared to the second embodiment described above.

When the first step of supplying the first source material includes a process of supplying at least one compound selected from among the amine-based compound and the amidine-based compound described above, the fifth step may use, as the second source material, the organic metal compound including the divalent positive ion. On the other hand, for example, when the first step of supplying the first source material includes a process of supplying the organic metal compound including the divalent positive ion, the fifth step may use, as the second source material, at least one compound selected from among the amine-based compound and the amidine-based compound described above.

The first reactant and the second reactant may include the same hydrogen halide, or may include different hydrogen halides. Also, all of the third step and the third step may comprise supplying hydrogen halide in a plasma state, but depending on the case, the third step is possible to supply hydrogen halide in a plasma state and the fifth step is possible to supply hydrogen halide without plasma.

Moreover, the first step of supplying the first source material or the fifth step of supplying the second source material and the second reactant may further include a process of supplying the at least one alkali metal-based compound as a third source material.

Depending on the case, the ALD process according to the third embodiment of the present inventive concept may comprise a seventh step of supplying a third source material by supplying the at least one alkali metal-based compound after the sixth step, an eighth step of purging the third source material, a ninth step of supplying a third reactant into the chamber, and a tenth step of purging the third reactant and may include a process of repeatedly performing one cycle including the first to tenth steps.

Alternatively, the ALD process according to the third embodiment of the present inventive concept may further include a seventh step of supplying a third source material of the at least one alkali metal-based compound and simultaneously supplying a third reactant material after the sixth step and an eight step of purging the third source material and the third reactant and may include a process of repeatedly performing one cycle including the first to eighth steps.

An ALD process according to a fourth embodiment of the present inventive concept may include a first step of supplying a first source material into a chamber, a second step of purging the first source material, a third step of simultaneously supplying a first reactant and a second source material into the chamber, and fourth step of purging the first reactant and the second source material, and may include a process of repeatedly performing one cycle including the first to fourth steps. The fourth embodiment includes a step similar to the first embodiment, and in a case where a material where a grain size thereof grows very largely is used, the fourth embodiment has an advantage where the fourth embodiment may be usefully used to control a constant grain size.

When the first step of supplying the first source into the chamber material includes a process of supplying at least one compound selected from among the amine-based compound and the amidine-based compound described above, the third step may use, as the second source material, the organic metal compound including the divalent positive ion. On the other hand, for example, when the first step of supplying the first source material includes a process of supplying the organic metal compound including the divalent positive ion, the third step may use, as the second source material, at least one compound selected from among the amine-based compound and the amidine-based compound described above.

The first reactant may include hydrogen halide. Also, the third step may supply hydrogen halide in a plasma state.

Moreover, the first step of supplying the first source material or the third step of supplying the first reactant and the second source material may further include a process of supplying the at least one alkali metal-based compound as a third source material. Depending on the case, the ALD process according to the fourth embodiment of the present inventive concept may comprise a fifth step of supplying a third source material by supplying the at least one alkali metal-based compound after the fourth step, a sixth step of purging the third source material, a seventh step of supplying a second reactant into the chamber, and an eighth of purging the second reactant and may include a process of repeatedly performing one cycle including the first to eighth steps.

Alternatively, the ALD process according to the fourth embodiment of the present inventive concept may further include a fifth step of supplying a third source material of the at least one alkali metal-based compound and simultaneously supplying a second reactant material after the fourth step and a sixth step of purging the third source material and the second reactant and may include a process of repeatedly performing one cycle including the first to sixth steps.

A thin film of a perovskite compound formed by the ALD process may have a thickness which is thinner than that of a thin film of a perovskite compound formed by the CVD process, and thus, a light transmittance may be enhanced.

FIGS. 1A to 1D are process cross-sectional views illustrating a method of manufacturing a solar cell according to an embodiment of the present inventive concept.

First, as seen in FIG. 1A, a crystalline sola cell 100 is manufactured.

The crystalline solar cell 100 is manufactured through a process of etching one surface of a semiconductor substrate 110 such as a wafer to form a concave-convex structure, doping a certain dopant on the one surface of the semiconductor substrate 110 to form a first semiconductor layer 120, and doping a certain dopant on the other surface of the semiconductor substrate 110 to form a second semiconductor layer 130.

As the one surface of the semiconductor substrate 110 is formed in the concave-convex structure, the first semiconductor layer 120 is formed in a shape corresponding to the concave-convex structure.

Moreover, in the drawing, an example is illustrated where the other surface of the semiconductor substrate 110 is formed in a flat structure and thus the second semiconductor layer 130 is formed in a flat structure. However, the present inventive concept is not limited thereto, and the other surface of the semiconductor substrate 110 may be formed in the concave-convex structure and the second semiconductor layer 130 may be formed in a shape corresponding to the concave-convex structure of the other surface of the semiconductor substrate 110.

The semiconductor substrate 110 may include a P-type or N-type wafer, the first semiconductor layer 120 may be doped with a dopant having a polarity which differs from that of the semiconductor substrate 110, and the second semiconductor layer 130 may be doped with a dopant having a polarity which is same as that of the semiconductor substrate 110. For example, the semiconductor substrate 110 may include a P-type wafer, the first semiconductor layer 120 may be doped with an N-type dopant, and the second semiconductor layer 130 may be doped with a P-type dopant to form a P+ layer.

Figure 1B:
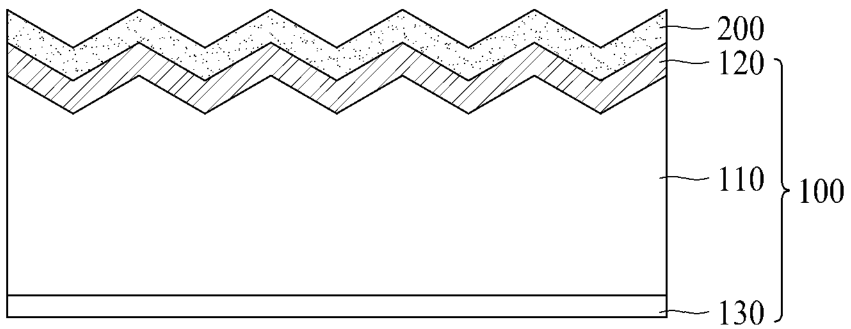

Subsequently, as seen in FIG. 1B, a buffer layer 200 is formed on the crystalline solar cell 100.

The buffer layer 200 is formed on the first semiconductor layer 120. As the first semiconductor layer 120 is formed in a concave-convex structure, the buffer layer 200 is formed in a shape corresponding to the concave-convex structure.

The buffer layer 200 is provided between the crystalline solar cell 100 and a below-described perovskite solar cell 300, and thus, a solar cell according to an embodiment of the present inventive concept has a structure of a tandem solar cell on the basis of a tunnel junction.

It is preferable that the buffer layer 200 includes a material for enabling light having a long wavelength, passing through the perovskite solar cell 300, to be incident on the crystalline solar cell 100 without being lost. For example, the buffer layer 200 may include transparent conductive oxide, a carbonaceous conductive material, a metal material, or a conductive polymer, and depending on the case, an n-type or p-type dopant may be doped on the material.

Figure 1C:
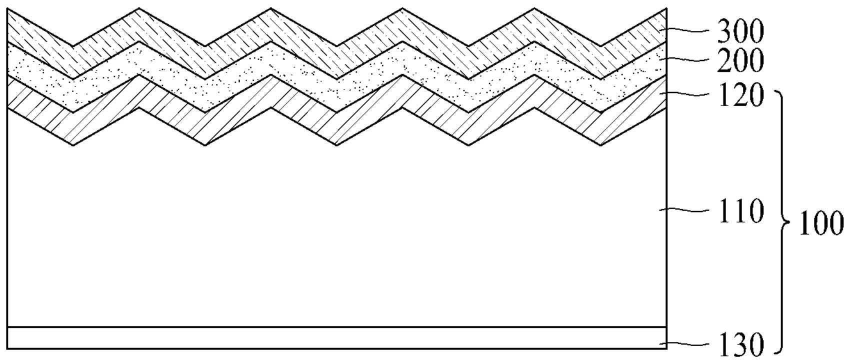

Subsequently, as seen in FIG. 1C, the perovskite solar cell 300 is formed on the buffer layer 200.

The perovskite solar cell 300 may include a first conductive charge transfer layer provided on the buffer layer 200, a light absorption layer provided on the first conductive charge transfer layer, and a second conductive charge transfer layer provided on the light absorption layer.

The first conductive charge transfer layer may include an electron transfer layer and the second conductive charge transfer layer may include a hole transfer layer. Alternatively, the first conductive charge transfer layer may include a hole transfer layer and the second conductive charge transfer layer may include an electron transfer layer. The electron transfer layer may include a compound which includes an N-type organic material such as bathocuproine (BCP), C60, or phenyl-C61-butyric acid methyl ester (PCBM), or various N-type metal oxides such as ZnO, c-$TiO_2$/mp-$TiO_2$, $SnO_2$, or IZO known to those skilled in the art, and various organic or inorganic materials. The hole transfer layer may include a compound including various N-type organic materials such as Spiro-MeO-TAD, Spiro-TTB, polyaniline, polyphenol, poly(3,4-ethylenedioxythiophene) polystyrene sulfonate (PEDOT-PSS), polymer (poly [bis(4-phenyl)(2,4,6-trimethylphenyl)amine]) (PTAA), or poly(3-hexylthiophene-2,5-diyl) (P3HT) known to those skilled in the art, or may include a compound which includes various P-type metal oxides, such as Ni oxide, Mo oxide, V oxide, W oxide, or Cu oxide known to those skilled in the art, and various organic or inorganic materials.

The light absorption layer includes the thin film of the perovskite compound described above, and thus, a repeated description of the light absorption layer is omitted.

Figure 1D:
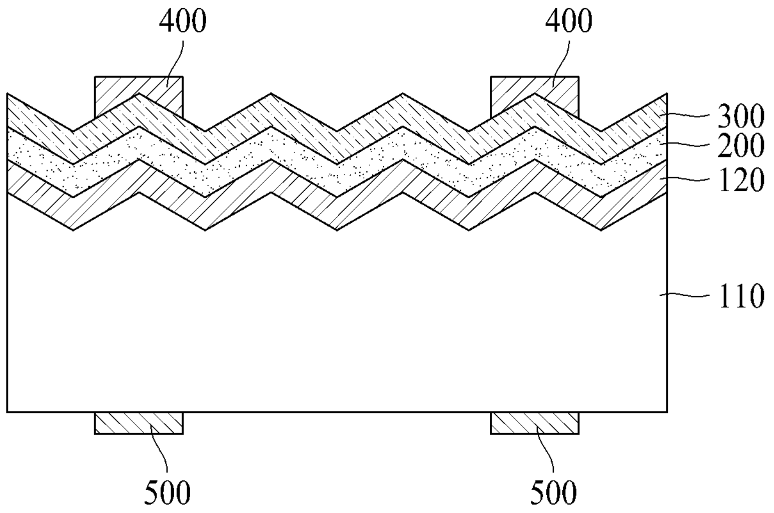

Subsequently, as seen in FIG. 1D, a first electrode 400 is formed on a top surface of the perovskite solar cell 300, and a second electrode 500 is formed on a bottom surface of the crystalline solar cell 100.

The first electrode 400 is formed on an incident surface on which sunlight is incident, and thus, is patterned in a certain shape. The second electrode 500 may be patterned in a certain shape, and thus, may be configured so that reflected light of sunlight is incident on an inner portion of a solar cell, but the present inventive concept is not limited thereto.

FIGS. 2A to 2E are process cross-sectional views illustrating a method of manufacturing a solar cell according to another embodiment of the present inventive concept.

Figure 2A:
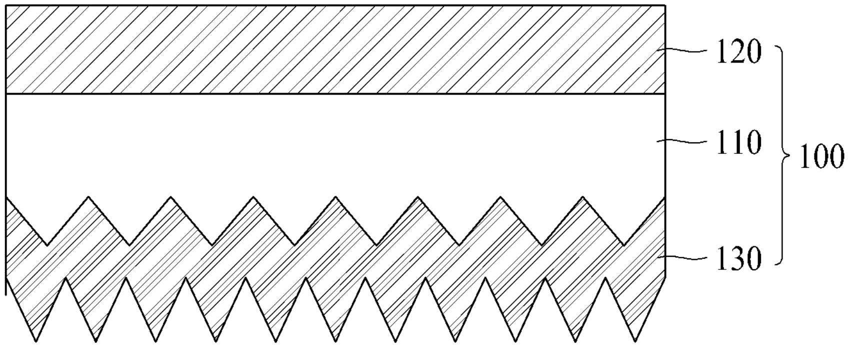
FIGS. 2A to 2E are process cross-sectional views illustrating a method of manufacturing a solar cell according to another embodiment of the present inventive concept.

First, as seen in FIG. 2A, a crystalline sola cell 100 is manufactured.

The crystalline solar cell 100 may be manufactured through a process of etching a bottom surface of a semiconductor substrate 110 to form a concave-convex structure, doping a certain dopant on a top surface of the semiconductor substrate 110 to form a first semiconductor layer 120, and doping a certain dopant on the bottom surface of the semiconductor substrate 110 to form a second semiconductor layer 130.

As the bottom surface of the semiconductor substrate 110 is formed in the concave-convex structure, the second semiconductor layer 130 is formed in a shape corresponding to the concave-convex structure.

The first semiconductor layer 120 may be doped with a dopant having a polarity which differs from that of the semiconductor substrate 110, and the second semiconductor layer 130 may be doped with a dopant having a polarity which is same as that of the semiconductor substrate 110.

Figure 2B:
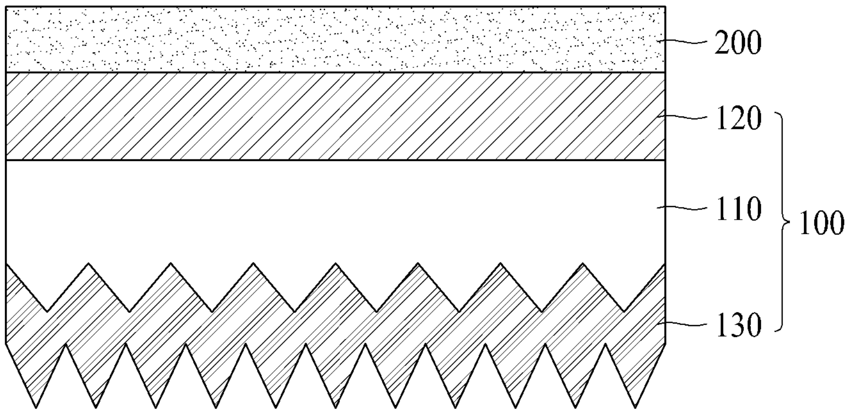

Subsequently, as seen in FIG. 2B, a buffer layer 200 is formed on a top surface of the crystalline solar cell 100.

The buffer layer 200 is formed on the first semiconductor layer 120. As the first semiconductor layer 120 is formed in a flat structure, the buffer layer 200 is also formed in a flat structure.

The buffer layer 200 is the same as the above-described embodiment, and thus, a repeated description is omitted.

Figure 2C:
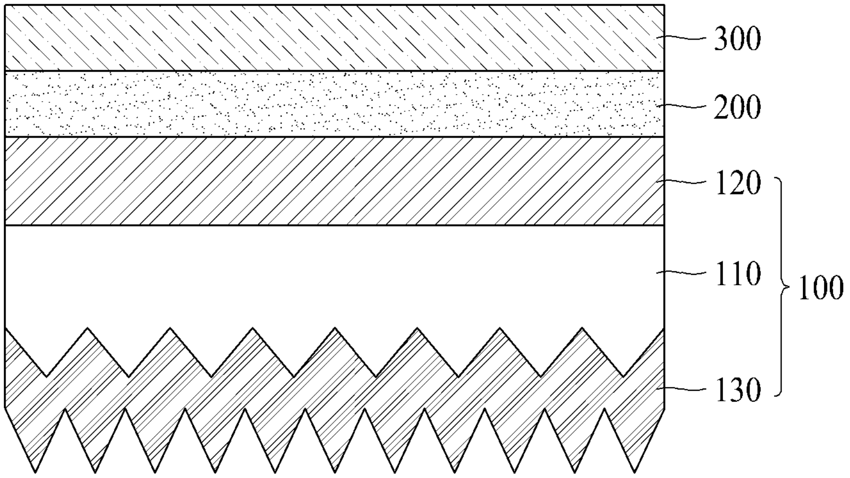

Subsequently, as seen in FIG. 2C, a perovskite solar cell 300 is formed on the buffer layer 200. As the buffer layer 200 is formed in a flat structure, the perovskite solar cell 300 may be formed in a flat structure. The perovskite solar cell 300 is the same as the above-described embodiment, and thus, a repeated description is omitted.

Figure 2D:
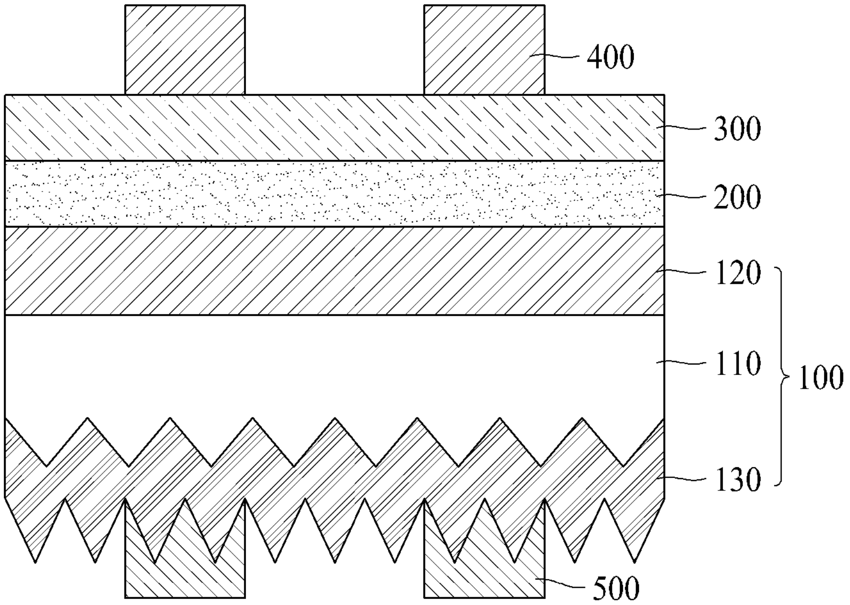

Subsequently, as seen in FIG. 2D, a first electrode 400 is formed on a top surface of the perovskite solar cell 300, and a second electrode 500 is formed on a bottom surface of the crystalline solar cell 100.

The first electrode 400 and the second electrode 500 are the same as the above-described embodiment, and thus, a repeated description is omitted.

Figure 2E:
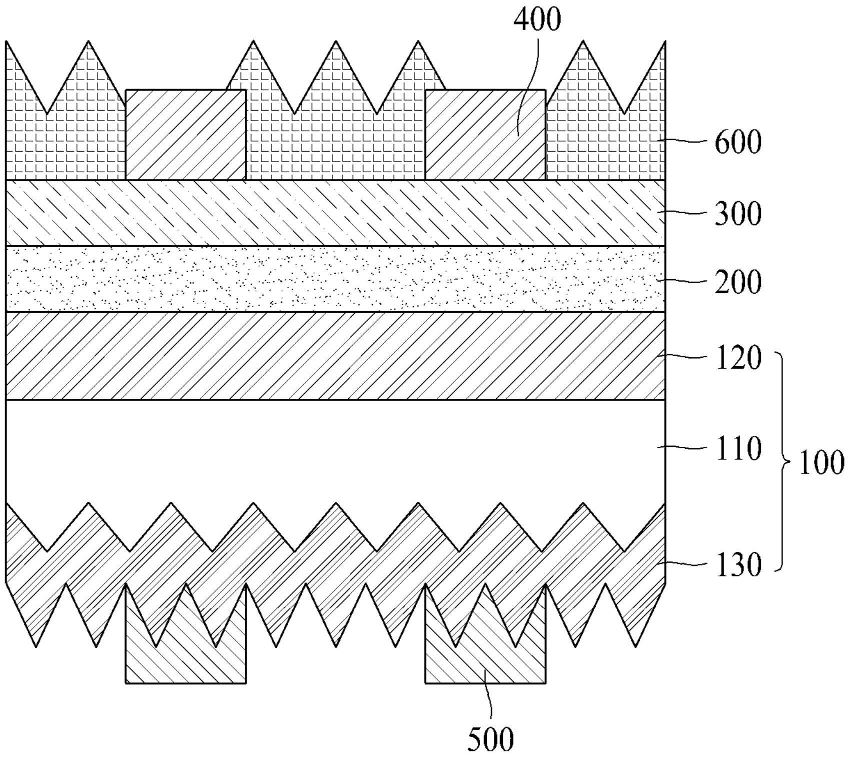

Subsequently, as seen in FIG. 2E, a passivation layer 600 having a concave-convex structure is formed on the first electrode 400. At this time, the first electrode 400 may be exposed by etching a portion of the passivation layer 600.

As the passivation layer 600 is formed in the concave-convex structure, the amount of light incident on the perovskite solar cell 300 may increase.

The passivation layer 600 may include polydimethylsiloxane, and when the polydimethylsiloxane is formed on the perovskite solar cell 300, a concave-convex structure having a micro pyramid structure may be obtained.

FIGS. 3A to 3E are process cross-sectional views illustrating a method of manufacturing a solar cell according to another embodiment of the present inventive concept.

Figure 3A:
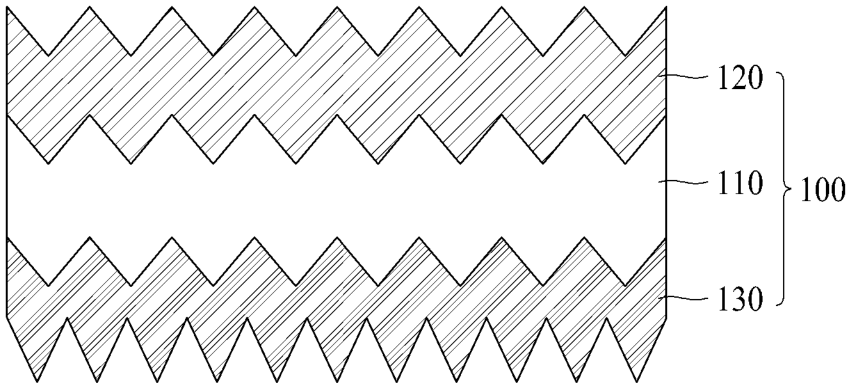
FIGS. 3A to 3E are process cross-sectional views illustrating a method of manufacturing a solar cell according to another embodiment of the present inventive concept.

First, as seen in FIG. 3A, a crystalline sola cell 100 is manufactured.

The crystalline solar cell 100 is manufactured through a process of etching one surface and the other surface of a semiconductor substrate 110 to form a concave-convex structure, doping a certain dopant on the one surface of the semiconductor substrate 110 to form a first semiconductor layer 120, and doping a certain dopant on the other surface of the semiconductor substrate 110 to form a second semiconductor layer 130.

As the one surface and the other surface of the semiconductor substrate 110 are formed in the concave-convex structure, each of the first semiconductor layer 120 and the second semiconductor layer 130 is formed in a shape corresponding to the concave-convex structure.

The first semiconductor layer 120 may be doped with a dopant having a polarity which differs from that of the semiconductor substrate 110, and the second semiconductor layer 130 may be doped with a dopant having a polarity which is same as that of the semiconductor substrate 110.

Figure 3B:
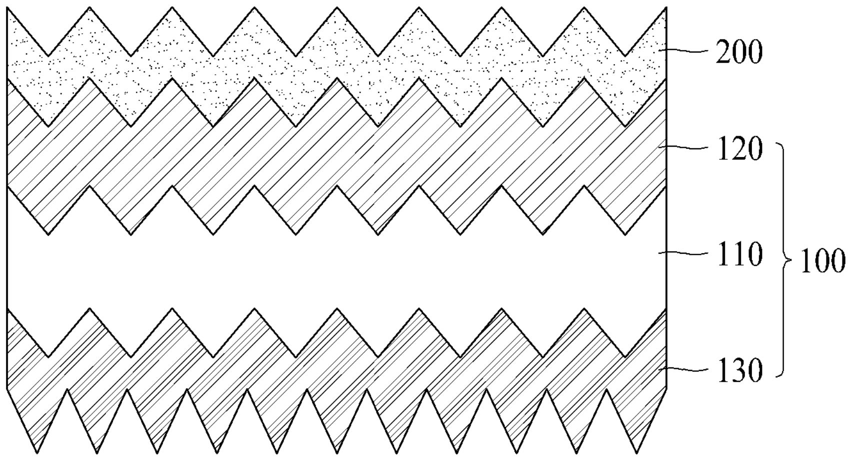

Subsequently, as seen in FIG. 3B, a buffer layer 200 is formed on a top surface of the crystalline solar cell 100.

The buffer layer 200 is formed on the first semiconductor layer 120. As the first semiconductor layer 120 is formed in a concave-convex structure, the buffer layer 200 is formed in the concave-convex structure.

The buffer layer 200 is the same as the above-described embodiment, and thus, a repeated description is omitted.

Figure 3C:
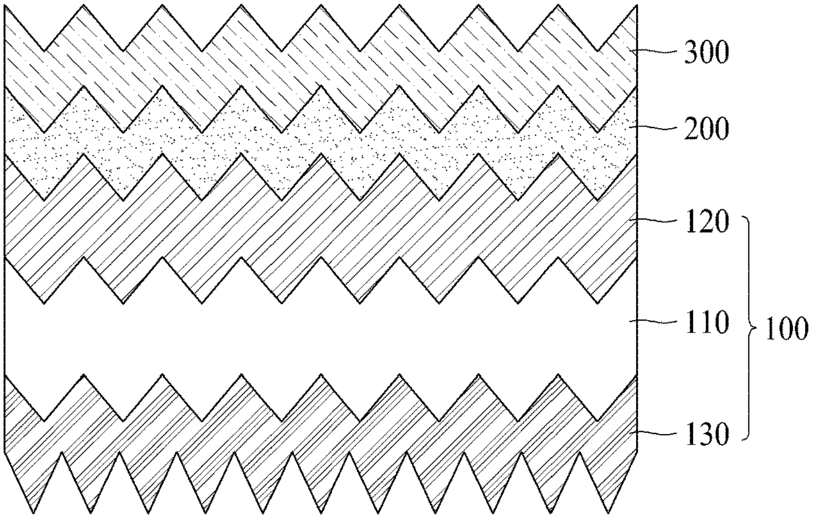

Subsequently, as seen in FIG. 3C, a perovskite solar cell 300 is formed on the buffer layer 200. As the buffer layer 200 is formed in a concave-convex structure, the perovskite solar cell 300 may be formed in a concave-convex structure. The perovskite solar cell 300 is the same as the above-described embodiment, and thus, a repeated description is omitted.

Figure 3D:
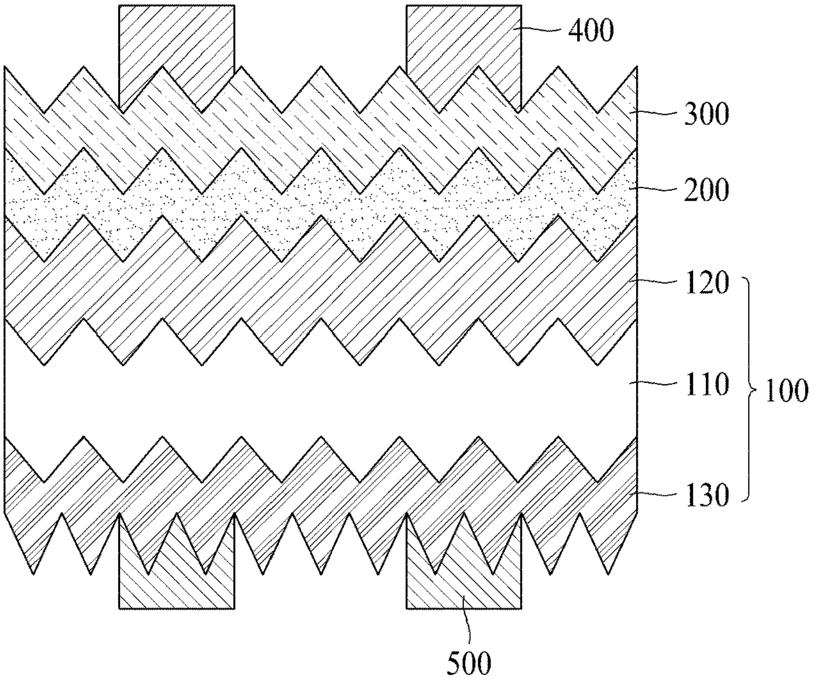

Subsequently, as seen in FIG. 3D, a first electrode 400 is formed on a top surface of the perovskite solar cell 300, and a second electrode 500 is formed on a bottom surface of the crystalline solar cell 100.

The first electrode 400 and the second electrode 500 are the same as the above-described embodiment, and thus, a repeated description is omitted.

Figure 3E:
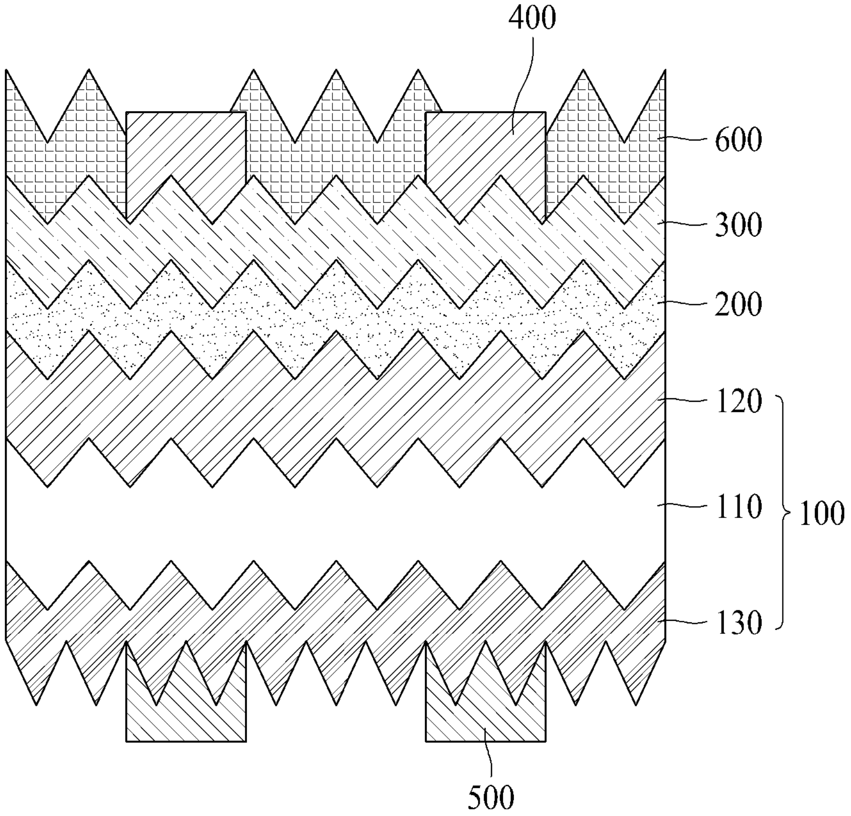

Subsequently, as seen in FIG. 3E, a passivation layer 600 is formed on the first electrode 400. At this time, the first electrode 400 may be exposed by etching a portion of the passivation layer 600.

As the perovskite solar cell 300 is formed in a concave-convex structure, the passivation layer 600 may be formed in a concave-convex structure. The passivation layer 600 may be formed of various materials such as SiO, SiON, SiN, $Al_2O_3$, or MgF.

Hereinabove, the embodiments of the present inventive concept have been described in more detail with reference to the accompanying drawings, but the present inventive concept is not limited to the embodiments and may be variously modified within a range which does not depart from the technical spirit of the present inventive concept. Therefore, it should be understood that the embodiments described above are exemplary from every aspect and are not restrictive. It should be construed that the scope of the present inventive concept is defined by the below-described claims instead of the detailed description, and the meanings and scope of the claims and all variations or modified forms inferred from their equivalent concepts are included in the scope of the present inventive concept.

The invention claimed is:

1. A method of manufacturing a thin film of a perovskite compound, the method comprising:

reacting (i) at least one compound selected from among an amine-based compound and an amidine-based compound, (ii) an organic metal compound including a divalent positive ion, (iii) at least one hydrogen halide and (iv) at least one alkali metal-based compound through a chemical vapor deposition (CVD) process by supplying the at least one compound, the organic metal compound, the at least one hydrogen halide and the at least one alkali metal-based compound in a chamber, wherein the at least one compound selected from among an amine-based compound and an amidine-based compound is selected from the group consisting of methylamine, ethylamine, phenethylamine, and formamidine, wherein the organic metal compound including the divalent positive ion is selected from the group consisting of $Pb(CH_3)_4$, $Pb(C_2H_5)_4$, $Pb(SCN)_2$, $(C_2H_5)_3PbOCH_2C(CH_3)_3$, $Pb(C_{11}H_{19}O_2)_2$, $Pb((CH_3)_3C—COCHCO—C(CH_3)_3)_2$, $Pb((C_6H_5)_2PCH_2P(C_6H_5)_2)_2$, $Pb(N(CH_3)_2C(CH_3)_2OH)_2$, $C_{12}H_{28}N_2O_2Pb$, and a compound represented by the following Chemical Scheme 1:

Chemical Scheme 1

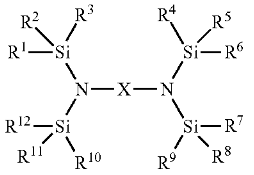

(In the Chemical Scheme 1, each of $R^1$ to $R^{12}$ is independently composed of hydrogen or an alkyl group, and the X is selected from a group consisting of Pb, Sn, Ge, Sb, Bi, and Ba), wherein the perovskite compound comprises a compound of $CABX_3$, where the Cis composed of the at least one alkali metal, the A is composed of a monovalent organic positive ion of the amine-based compound or a monovalent organic positive ion of the amidine-based compound, the B is composed of the divalent positive ion, and the X is composed of at least one halogen compound.

2. The method of claim 1, wherein the CA is composed in a structure where a monovalent organic positive ion of the amine-based compound is added thereto at an x ratio, a monovalent organic positive ion of the amidine-based compound is added thereto at a y ratio, and a monovalent positive ion of the alkali metal is added thereto at a z ratio, each of x, y and z is more than 0, and x+y+z=1.

3. The method of claim 1, wherein the alkali metal-based compound is composed of a compound represented by the following Chemical Scheme 2:

Chemical Scheme 2

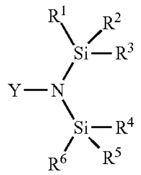

(In the Chemical Scheme 2, each of $R^1$ to $R^6$ is independently composed of hydrogen or an alkyl group, and the Y is alkali metal).

4. The method of claim 1, wherein hexamethyldisilazane is obtained as a byproduct of the reaction.

5. The method of claim 1, wherein the method is performed at a temperature within a range of a room temperature to 200° C.

* * * * *